United States Patent [19]
Young

[11] Patent Number: 4,785,427
[45] Date of Patent: Nov. 15, 1988

[54] DIFFERENTIAL BIT LINE CLAMP

[75] Inventor: Kenneth E. Young, Newark, Calif.

[73] Assignee: Cypress Semiconductor Corporation, San Jose, Calif.

[21] Appl. No.: 7,957

[22] Filed: Jan. 28, 1987

[51] Int. Cl.[4] .......................... G11C 7/00; G11C 7/02; G11C 8/00

[52] U.S. Cl. ................................. 365/189; 365/207; 365/242

[58] Field of Search ................ 365/189, 203, 207, 242

[56] References Cited

U.S. PATENT DOCUMENTS

| | | | |
|---|---|---|---|
| 4,612,631 | 9/1986 | Ochii | 365/203 |
| 4,616,344 | 10/1986 | Noguchi et al. | 365/203 |
| 4,627,032 | 12/1986 | Kolwicz et al. | 365/203 |
| 4,656,608 | 4/1987 | Aoyama | 365/203 |

OTHER PUBLICATIONS

IBM Technical Disclosure Bulletin, Barsuhn et al., "Semiconductor Storage Circuit Utilizing Two Device Memory Cells", vol. 18, No. 3, Aug. 1975.

Primary Examiner—Terrell W. Fears
Assistant Examiner—Melissa J. Koval
Attorney, Agent, or Firm—Blakely, Sokoloff, Taylor & Zafman

[57] ABSTRACT

A semiconductor memory for storing binary data which may be accessed more rapidly is disclosed which semiconductor memory includes a pair of differential bit lines for receiving signals corresponding to the binary data; a semiconductor memory device for storing binary data is coupled between the differential bit lines to provide signals corresponding to the binary data when reading the semiconductor memory device during the read cycle. A semiconductor clamping device is coupled between the differential bit lines to selectively provide a current path between the differential bit lines during the reading of the semiconductor device.

12 Claims, 2 Drawing Sheets

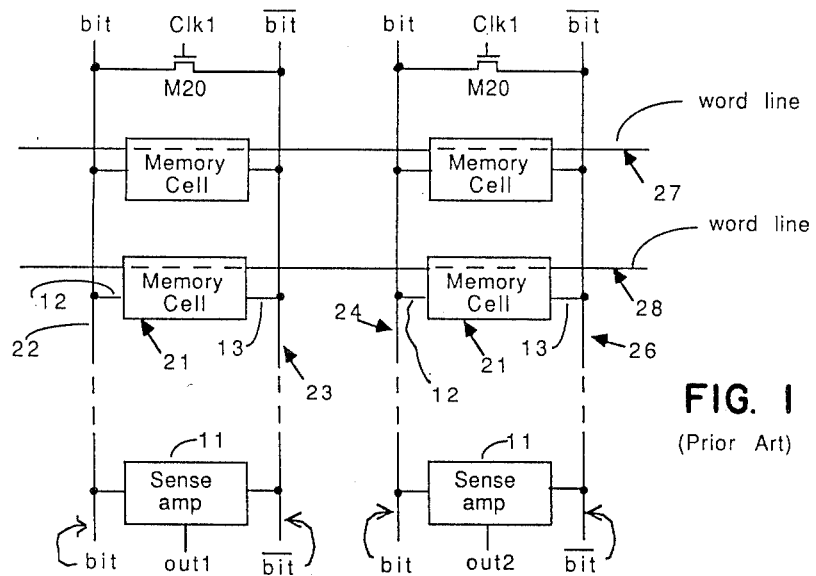
FIG. 1 (Prior Art)
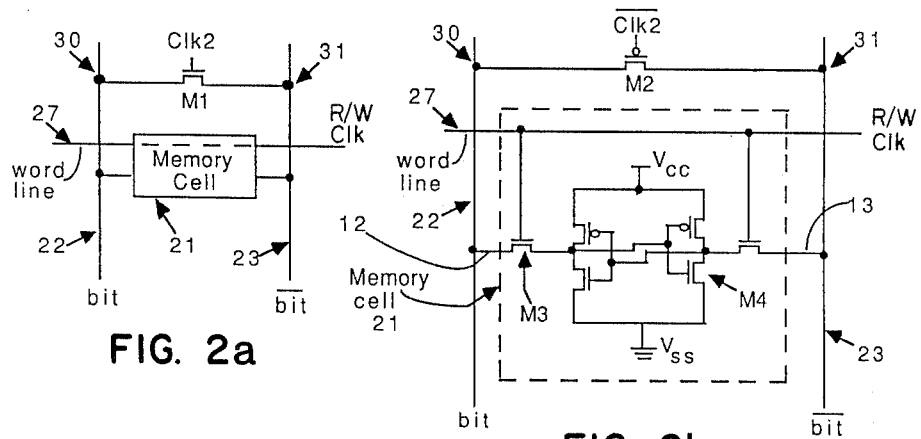
FIG. 2a
FIG. 2b

→ TIME

DIFFERENTIAL BIT LINE CLAMP

BACKGROUND OF THE INVENTION

The field of this invention relates to semiconductor memory devices utilizing differential data lines for detection and determination of binary data and particularly the elements involved in reading and writing to semiconductor memory devices.

Prior art semiconductor memories utilizing differential data (bit) lines typically involve a column of memory cells between two differential bit lines. Each of the memory cells are coupled to both differential bit lines, and a sense amplifier also coupled to each of the differential bit lines senses the binary state of one of the memory cells in the column of memory cells arranged between the differential bit lines (see for example FIG. 1).

There are typically many columns which are arranged on a semiconductor chip and each of those columns is becoming increasingly filled with more memory cells which are being decreased to take up less chip area. These smaller memory cells store less charge which must create voltage swings on the bit and bit bar lines to be sensed by the sense amplifier. Typically, one memory cell in the entire column of memory cells is selected to be read by applying a read signal on a word line coupled to the particular memory cell. That read signal causes the memory cell to be coupled to both bit lines where the difference in voltage between the two bit lines is compared by the sense amplifier. That difference determines the output from the sense amplifier which represents the binary logic state of he memory cell which was selected and read.

Increasing miniaturization has caused the memory cells to store less charge, which charge must create voltage swings on the differential bit lines. Moreover, larger arrays have increased the parasitic capacitance (particularly the capacitance caused by the long bit lines insulated from the semiconductor substrate) of the bit lines such that more time is required to charge and discharge the parasitic capacitive loads by the smaller memory cells which store less charge.

A prior art solution to this problem involves precharging the bit lines to a particular value, which is usually intermediate between the voltage levels which represent the extremes of the binary logic states. Thus, for example, if the extreme high for representing a binary one is 5 volts and the extreme low for representing a binary zero is 0 volts, precharging of the bit lines would apply 2½ volts on each bit line so that a particular memory cell would have to drive each of the differential bit lines only 2½ volts in the appropriate direction.

One particular form of prior art involves the use of a recovery pulse prior to the actual reading of the memory cell device. The recovery pulse does not occur during the reading of the memory cell. Such a prior art device is shown in FIG. 1, where a portion of a semiconductor memory is shown. The memory includes a plurality of memory cells 21 which store binary data. The memory cells are arranged in columns, there being two columns of memory cells shown in FIG. 1. A pair of differential bit lines, arranged as two columns, surround each column of memory cells. Thus, one differential bit line 22 (bit) is associated with its inverse, the other differential bit line (bit bar) 23. Each memory cell 21 has a first output 12 and a second output 13 which couple the memory cell between the differential bit lines to provide signals which correspond to the binary data stored in the memory cell when reading that memory cell. Of course, these lines 12 and 13 provide the signals corresponding to a binary state when writing to the memory cell. A sense amplifier 11, having differential inputs, as is well known in the art, is also coupled between each pair of differential bit lines. Word line 27 and word line 28, arranged as rows, are coupled to the memory cells as shown in FIG. 1. Thus, for example, word line 28 is coupled to each memory cell 21 which is coupled via outputs 12 and 13, to bit line 22 and bit bar 23. A read/write clock means is usually coupled to the word lines to supply a read or write signal over the word line to the memory cell to permit the memory cell to be written to or be read from.

Also coupled between the pair of differential bit lines is an MOS field effect device M20, shown in FIG. 1, the gate of which is coupled to a clock 1 (CLK 1) signal; this field effect device serves to equalize the differential bit lines during a recovery pulse which occurs prior to the actual reading of the memory cell. A typical sequence of this prior art memory, shown in FIG. 1, will be described illustrating the recovery pulse. Assume a read cycle (for reading the lower left cell 21 between lines 22 and 23) is ending where the bit line 22 is high at substantially 5 volts and the bit bar line 23 is low at substantially 0 volts. Prior to the next reading of memory cell 21, the recovery pulse occurs by applying the clock signal CLK 1 to the gate of M20 which is coupled to a clock which provides a signal CLK 1. In the embodiment shown in FIG. 1, CLK 1 provides a high signal (e.g. 5 volts) during the recovery pulse which causes M20 to conduct allowing a current path to develop between the pair of differential bit lines which causes those pair of differential bit lines to be equalized at approximately the same voltage. In this particular instance, the CLK 1 clock pulse causes the pair of differential bit lines to be equalized at a voltage which may be 2½ volts, which is intermediate between the extremes of the voltage ranges allocated to the binary data. The recovery pulse lasts for a certain period of time, which time is designed to assure that the pair of differential bit lines will be substantially equalized at the end of the recovery pulse. For this purpose, the gate width of devices such as M20 are typically large to permit considerable current flow. Following the recovery pulse, a memory cell is selected for reading by asserting the appropriate word line. Thus, for example, a read signal is applied to word line 28 causing memory cells 21 in both columns shown in FIG. 1 to be activated for reading by the sense amplifiers 11. The memory cells 21 produce their output at outputs 12 and 13; the output from the lower left cell 21 between lines 22 and 23 drives, in this particular example, bit line 22 high (to about 5 volts) and bit bar line 23 low to about 0 volts.

It can be seen that even with the recovery pulses, large voltage swings occur on the differential bit lines. Because of the parasitic capacitance loads and the small memory cells, time is required for those differential bit lines to be driven through those large voltage swings. Without the use of a recovery pulse or a precharging of the differential bit lines, even larger voltage swings occur on the differential bit lines requiring more time to charge and discharge parasitic capacitive loads. Whether or not the recovery pulse is used, the large voltage swings cause power spikes on the power supply lines, such as Vcc which is usually a power supply voltage (e.g. 5 volts) as well as Vss, a second power supply which is often ground. The voltages described herein are usually with respect to ground. Moreover, positive (5 volt) logic is described throughout.

It is an object of the invention to keep the analog voltage swings on the differential bit lines in memory devices small while performing a read operation. Moreover, it is an object of the present inventiOn to avoid the power spikes occurring on the power supply lines caused the the large voltage supply swings. Moreover, it is an object of this invention to provide semiconductor memory devices having faster access time when reading the memory devices.

SUMMARY OF THE INVENTION

The present invention provides an apparatus and method for semiconductor memory having faster access time by clamplng a pair of differential bit lines which receive signals corresponding to the binary data stored in the semiconductor memory devices which are coupled between the pair of differential bit lines. The memory includes a pair of differential bit lines between which is coupled a semiconductor clamping device designed to provide a current path between the pair of differential bit lines. That current path is controlled by a control element which controls current flowing between one end of the current path and the other end of the current path. The one end of the current path is coupled to one differential bit line and the other end of the current path is coupled to the other differential bit line to provide a current path between those differential bit lines. The current path is provided whenever reading the semiconductor memory devices which are coupled between the differential bit lines. A clock means provides a clock signal to the control element of the semiconductor clamping device, which clock signal appears during each read cycle, usually during the entire read cycle. Thus, during a read cycle, a current path is provided between the differential bit lines, which current path reduces the voltage difference between the differential bit lines to a value dependent upon the resistance of the current path of the semiconductor clamping device. In effect, the sense amplifier in one binary state, senses that one side of the current path (provided by the semiconductor clamping device) is high while the other side is low; and in the other binary state the amplifier senses that the other side of the current path is high while the one side is low.

DESCRIPTION OF THE DRAWINGS

FIG. 1 is a schematic illustration of a prior art semiconductor memory arranged in rows and columns.

FIG. 2a is a schematic illustration of one embodiment of the present invention.

FIG. 2b is a schematic illustration of another embodiment of the present invention and shows an example of a memory cell device.

DETAILED DESCRIPTION OF THE INVENTION

The present invention, including its apparatus and method, will be described with reference to the drawings which illustrate embodiments of the invention. Specific details pertinent to the invention will be described for a thorough understanding of the invention; however, in order not to unnecessarily obscure the invention, certain items will be described in general as they are understood by those ordinarily skilled in the art. Thus, well known circuits and general architectures of semiconductor memories will be illustrated in block diagrams and described generally.

The general architecture of semiconductor memories is well known in the art and may be explored by reference to various textbooks and patents (e.g. *Principles of CMOS VLSI Desion,* N. Weste and K. Eshraghian, Addison-Wesley, 1985; *Indrocution to VLSI System,* C. Mead and L Conway, Addison-Wesley, 1980). As indicated above, the general architecture of semiconductor memories is similar to the type illustrated in FIG. 1 wherein columns of memory cells are arranged between pairs of differential bit lines (i.e. bit and bit bar). A sense amplifier 11 is also normally coupled between the differential lines formed by bit line 22 and bit bar line 23. Typically, a sense amplifier is provided for each column of memory cells and the output from each sense amplifier (reflecting the value of the binary data in one of the cells in the column) is typically provided to other circuits which use the data retrieved from the memory cell. The binary data is written into the memory cells during write cycles and is read from the cells during read cycles.

FIG. 2a shows an embodiment of the present invention. A pair of differential bit lines (bit line 22 and bit bar line 23) are arranged in two columns and a word line 27 is arranged perpendicularly to both of those columns and is coupled to a memory cell 21 which is disposed between the pair of differential bit lines. It will be appreciated that the invention is typically used where there are a plurality of memory cells (not shown in FIG. 2a) arranged in a column between the two columns formed by the pair of differential bit lines and a sense amplifier 11 is also coupled between those lines. A semiconductor clamping device M1 is coupled between the pair of differential bit lines. As shown in FIG. 2a, the semiconductor clamping device M1 is an enhancement mode MOS field effect device having a gate, a source and a drain. The source and drain of M1 form a controlled current path which is controlled by the gate of M1 which acts as a control element which controls the current flowing between one end of the controlled current path and the other end of that path. As shown in FIG. 2a, node 30 includes one end of the controlled current path and node 31 is the other end of that path.

Figure 3A:
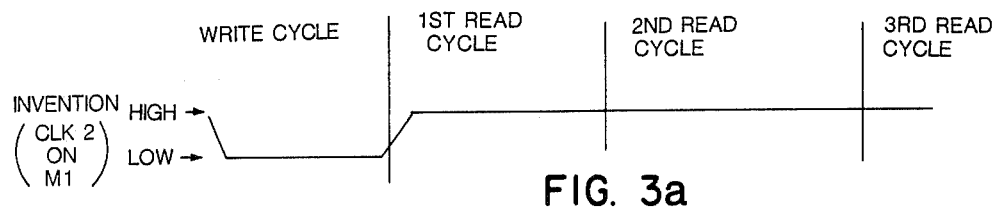
FIG. 3a–3d shows four voltage versus time graphs comparing the invention to prior art techniques.
Figure 3B:
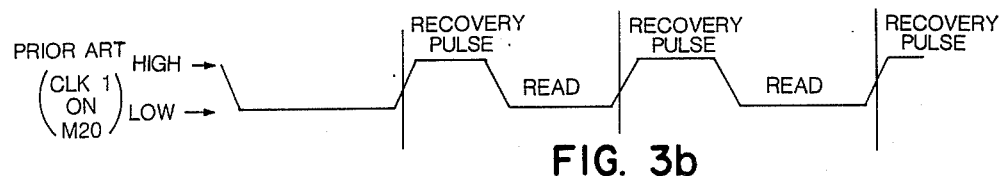
Figure 3C:
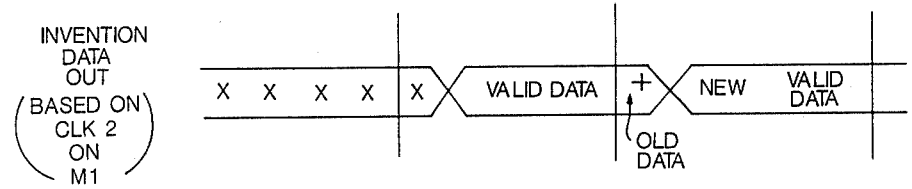
Figure 3D:
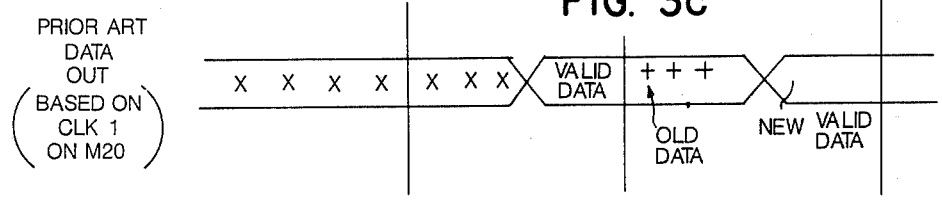

A clock means is included for the generation of a clock signal CLK 2 which signal is applied to the control element; for the embodiment shown in FIG. 2a the signal CLK 2 goes high (e.g. 5 volts) during each read cycle. Clock means for providing a signal CLK 2 are well known in the prior art; for example, the clock means which provides the clock signal CLK 2 may be similar to the read/write clock means which is coupled to the word lines, which provides the read and write signals utilized to access the various memory cells. The clock means, which is coupled to the gate of M1 to provide the clock signal CLK 2, typically exhibits a change in voltage level during each read cycle. The top graph ("A") of FIG. 3 illustrates such a change in voltage level. During the read cycle, the clock signal CLK 2 appearing at the gate of M1 will remain high during the entire read cycle causing current to flow between the source and drain of M1, which opens the current path formed by the source and drain of M1. During a write cycle M1, will not conduct as the clock signal CLK 2 is low, causing the current path of M1 to be closed; that is, no substantial current flows between nodes 30 and 31 during a write cycle.

During a write cycle, the bit line and bit bar line are appropriately charged (e.g. bit high and bit bar low or vice versa) and then a write signal is applied to the word lines, such as word line 27, which pormits the memory cell 21 to receive the charges placed on the bit and bit bar lines during the writing cycle. Thus, for example, if the bit line 22 is high then the bit bar line 23 will be low and the memory cell 21 will store those values accordingly such that when reading that memory cell the high value will appear on the bit line 22 and the low value will appear on the bit bar line 23.

Reading of the memory cell 21 shown in FIG. 2a occurs as follows. A read/write clock means, which is coupled to word line 27, provides a read signal over the word line which enables the memory cell 21 to produce, at its outputs 12 and 13, the differential logic states stored in memory cell 21. Thus, for example, if the bit line 22 was stored high and the bit bar line 23 was stored low, the memory cell 21 when read will produce a high signal on bit line 22 and a low signal on bit bar line 23. At substantially the same time that the read/write clock means provides a read signal over the word line 27, the clock means provides the signal CLK 2 to the gate of M1 causing M1 to conduct such that the current path between nodes 30 and 31 is open. Consequently, the voltage difference between the pair of bit lines when reading is substantially dependent on the resistance between the source and drain of M1 (i.e the resistance of the controlled current path when open). Thus, when the bit line 22 is high and the bit bar line 23 is low, node 30 will be high and node 31 will be low, and the difference between those nodes will be determined by the resistance of M1 when that device is "on" (that is, substantial current is flowing between the source and drain). The clock signal CLK 2 would normally be present at the gate of M1 during the entire reading of the memory cell 21 thereby preventing the pair of differential bit lines from having voltage swings which exceed the voltage difference dependent upon the resistance of M1 when substantial current is flowing through M1. It will be appreciated that a sense amplifier is, in effect, sensing which of nodes 30 and 31 are high.

The semiconductor device M1 is typically a smaller device (in gate width) than the prior art device M20 because the size of M1 is based on the maximum desired voltage differential between the pair of differential bit lines. The prior art device M20 was sized such that it had a large gate width to permit M20 to have a very small resistance across the source and drain to thereby substantially equalize the differential bit lines. It can be seen that the purpose served by M1 is different in that its size must determine the maximum voltage differential between the pair of differential bit lines. The voltage difference between the bit lines is a function of the size of M1 versus the size of the transistors in the memory cell which are conducting substantially when reading that cell. For example, when reading the memory cell 21 shown in FIG. 2b such that the differential bit line 22 is pulled high while the differential bit bar line 23 is pulled low, the transistors conducting will be M3 and M4; thus, the voltage differential between lines 22 and 23 will be dependent upon the ratio of M3 x M4 / M2; the values used for M2, M3 and M4 are the gate widths (not the gate length which is the distance the majority charge carriers travel from the source to the drain, often referred to as the channel length; see page 40 of *Princioles of CMOS VLSI Design, supra*). In practice, the sizes of the memory cell transistors are maintained constant and one would vary the size of the semiconductor clamping device, such as M1 or M2, to adjust the maximum voltage difference between the pair of differential bit lines. In the presently preferred embodiment, shown in FIG. 2a, M1 is an enhancement MOS field effect device with a threshold that could be typically 0.7 volts. The gate length is typically held constant while the gate width is varied to obtain a desired voltage difference between the bit and bit bar lines when sensing the memory cell. An example for the size of M1 may be a gate width of 10 microns while a pass transistor, such as M3 shown in FIG. 2b would have a gate width of 1.4 microns; such an arrangement would develop a bit/bit bar differential of approximately 200 millivolts. The semiconductor clamping device, such as M1 or M2, can be sized smaller (in gate width) for larger voltage differences between the bit and bit bar lines; that is, smaller gate widths allow less current to flow and thus permit larger voltage differences between the pair of differential bit lines. One may also vary the gate length, which is the distance between the source and drain that the majority charge carriers must travel in the channel region. Smaller gate lengths for M1 or M2 can be used to make the voltage difference between the pair of differential bit lines smaller because the resistance between the source and drain is decreased with decreasing gate lengths.

It should be noted that the sense amplifier selected to be used with the semiconductor of the invention (utilizing the semiconductor clamping device such as M1 or M2), should be sensitive enough to sense the voltage difference between the pair of differential bit lines. Such sense amplifiers are available and are well known in the prior art (soe, for example U.S. Pat. No. 4,081,701).

An alternative embodiment of the present invention is shown in FIG. 2b wherein a p-channel, enhancement mode, MOS device is utilized as the semiconductor clamping device, shown as M2 which is coupled between the differential bit lines by nodes 30 and 31. A clock bar signal, $\overline{CLK\ 2}$, is applied to the gate of M2. It will be appreciated that $\overline{CLK\ 2}$ is the inverse of CLK 2 such that $\overline{CLK\ 2}$ higher voltage during write cycles. FIG. 2b also shows an example of a memory device 21 which, in this case is a 6 transistor static random access memory (SRAM) implemented in CMOS (complimentary metal oxide semiconductor) technology. It will be appreciated that many different types of semiconductor memory devices may be utilized for the semiconductor memory cell 21. The particular embodiment of the memory cell device shown in FIG. 2b is a bistable semiconductor memory circuit (e.g. a flip-flop) having two differential outputs at 12 and 13, the one output being the binary inverse of the other output.

The operation of the semiconductor memory of the present invention will be illustrated with reference to FIGS. 2a and 3. FIG. 3 shows four voltage versus time graphs (A, B, C, and D). Graph A shows the voltage (signal CLK 2) at the gate of M1. over time while Graph B of FIG. 3 shows the clock signal CLK 1 (of the prior art) on the gate of M20. Graph C shows the data output from the semiconductor memory of the invention while Graph D shows the data output from prior art memories which are based on the clock signal CLK 1 on the gate of M20.

In the invention, the clock signal CLK 2 is low (e.g. about 0 volts) during the write cycle causing M1 to be "off"—no substantial current flowing; this permits the bit line 22 and the bit bar line 23 shown at FIG. 2a to be charged as much as possible to the limits of the ranges associated for the binary logic states. Thus, in a typical example, the bit line 22 will be charged close to 5 volts while the bit bar line 23 will be charged close to 0 volts causing the memory device to be charged such that when reading that memory device later, the bit line 22 will charge high (about 5 volts) and the bit line 23 will go low (about 0 volts). It is appreciated that during the writing to the memory cell 21, the word line 27 is asserted permitting the memory cell to receive the signals on the differential bit lines during writing. During the reading of the memory cell, the word line receives a read signal which permits the memory cell to drive the differential bit lines. At the same time, the CLK 2 signal appears high on the gate of M1 causing the controlled current path formed by the source and drain to conduct (be open) thereby clamping the maximum voltage difference between the pair of differential bit lines 22 and 23. Since the bit line 22 was stored high, node 30 will be high with respect to node 31 and the sense amplifier will sense the difference more quickly than the prior art memory using the recovery pulse. Thus, valid data appears more quickly using the invention as shown in Graph C of FIG. 3 than in the prior art data output shown in Graph D of FIG. 3. The prior art device M20 is on only between read cycles or at the end of a write cycle but is not on during the actual reading of the semiconductor memory device 21. If no recovery pulse is used, and thus there is no M20 transistor coupled between the bit lines, valid data takes even longer to output from the memory than the prior art memory with the recovery pulse.

While this invention has been described with reference to an illustrative embodiment, this description is not intended to be construed in the limiting sense. Various modifications of these embodiments, such as the use of other embodiments of semiconductor memory devices, will be apparent to a person skilled in the art upon reference to this description. It is therefore contemplated that many variations are possible without departing from the spirit or scope of the invention as claimed.

What is claimed:

1. A semiconductor memory for storing binary data, said memory comprising:
    a pair of differential bit lines for receiving signals corresponding to data;
    a semiconductor memory device for storing binary data, said semiconduct memory device being coupled between said pair of differential bit lines to provide said signals corresponding to the binary data when reading said semiconductor memory device during a read cycle;
    a clock means for providing a clock signal during said read cycle;
    a semiconductor device coupled between said pair of differential bit lines to selectively provide a current path between said pair of differential bit lines and having a control element which controls said current path such that said current path may be closed or open, said control element being coupled to said clock means to receive said clock signal such that when reading said semiconductor memory device said current path is open, whereby the voltage difference between said pair of differential bit lines is maintained during actual reading of said semiconductor memory device and said voltage difference is reduced by said current path.

2. A semiconductor memory as defined in claim 1 wherein said binary data is written into said semiconductor memory device during write cycles and is retrieved from said semconductor memory device during said read cycle.

3. A semiconductor memory as defined in claim 1 wherein said current path is open during the entirety of said read cycle.

4. A semiconductor memory as defined in claim 3 wherein said semiconductor memory device is an MOS static memory cell having a first and a second output, said first output being selectively coupled to one differential bit line of said pair of differential bit lines and said second output being selectively coupled to the other differential bit line, said first output being the binary inverse of said second output.

5. A semiconductor memory as defined in claim 4 wherein said binary data is written into said semiconductor memory device during write cycles and is retrieved from said semiconductor memory device during said read cycle and further comprising a read/write clock means for providing a read signal during said read cycle and a write signal during each write cycle, said read/write clock means being coupled to said semiconductor memory device to cause said first output to be coupled to the one differential bit line and to cause said second output to be coupled to the other differential bit line during said read cycle and during said write cycles.

6. A semiconductor memory for storing binary logic states, said binary logic states being written into said semiconductor memory during write cycles and being read from said semiconductor memory during read cycles, said semiconductor memory comprising:
    a pair of differential bit lines for receiving signals corresponding to the binary logic states during said read cycles and for providing signals corresponding to the binary logic states during said write cycles;
    a semiconductor memory cell for storing binary logic states and having a first and a second output, said first output being selectively coupled to one differential bit line of said pair of differential bit lines and said second output being selectively coupled to the other differential bit line;
    a read/write clock means for providing a read signal during each read cycle and a write signal during each write cycle, said read/write clock means being coupled to said semiconductor memory cell to cause said first output to be coupled to said one differential bit line and to cause said second output to be coupled to the other differential bit line during read cycles and during write cycles;
    a clock means for providing a clock signal during each read cycle;
    a semiconductor clamping device having a controlled current path and a control element which controls the current flowing between a one end of said controlled current path and an other end of said controlled current path such that said controlled current path may be closed or open, the one end of said controlled current path being coupled to the one differential bit line and the other end of said controlled current path being coupled to the other differential bit line, said control element being coupled to said clock means to receive said clock signal during each read cycle, said controlled current path being open during actual reading of said semiconductor memory cell to cause substantial current to flow between said pair of differential bit lines, the binary logic states retrieved from said semiconductor memory cell during a particular read cycle corresponding to the voltage difference maintained between said pair of differentail bit lines during said particular read cycle, said voltage difference maintained during said particular read cycle being limited by said controlled current path to a value dependent upon the resistance of said controlled current path when open, such that the voltage swings on the pair of differential bit lines are limited by said semiconductor clamping device.

7. An MOS static memory for storing binary logic states, said binary logic states being written into said MOS static memory during write cycles and being read from said MOS static memory during read cycles, said MOS static memory comprising:
 a pair of differential bit lines for receiving signals corresponding to the binary logic states during said read cycles and for providing signals corresponding to the binary logic states during said write cycles;
 a bistable semiconductor memory ciruict for storing binary logic states and having a first and a second output, said first output being selectively coupled to one differential bit line of said pair of differential bit lines and said second output being selectively coupled to the other differential bit line of said pair of differential bit lines, said first output being the binary inverse of said second output;
 a read/write clock means for providing a read signal during each read cycle for reading said bistable semiconductor memory circuit and a write signal during each write cycle, said read/write clock means being coupled to said bistable semiconductor memory circuit to cause said first output to be coupled to said one differential bit line and said second output to be coupled to the other differential bit line during read cycles and during write cycles;
 a clock means for providing a clock signal during reading of said bistable semiconductor memory circuit;
 an MOS field effect device having a gate, a source and a drain, one of said drain and said source being coupled to the one differential bit line and the other of said drain and said source being coupled to the other differential bit line to form a controlled current path between said pair of differential bit lines, said gate being coupled to said clock means to receive said clock signal during reading of said bistable semiconductor memory circuit, said gate controlling said controlled current path such that said controlled current path may be open or closed, said controlled current path being open during actual reading of said bistable semiconductor memory circuit to cause substantial current to flow between said pair of differential bit lines, the binary logic state retrieved from said bistable semiconductor memory circuit during a paticular read cycle corresponding to the voltage difference maintained between said pair of differential bit lines during said particular read cycle, said voltage difference maintained during said particular read cycle being reduced by said controlled current path to a value dependent upon the resistance of said controlled current path when open such that the voltage swings on the pair of differential bit lines are limited by said MOS field effect device whereby less time is required to read said bistable semiconductor memory circuit due to small voltage swings between the pair of differential bit lines.

8. The MOS static memory as defined in claim 7 further comprising:
 a sense amplifier for sensing the binary logic state of said bistable semiconductor memory circuit during said read cycles, said sense amplifier having a first and a second input and an data output, said first input coupled to the one differential bit line and said second input coupled to the other differential bit line, the value at said data output during said particular read cycle correspoonding to the binary logic state retrieved from said bistable semiconductor memory circuit.

9. The MOS static memory as defined in claim 8 wherein said one differential bit line forms a first column and said other differential bit line forms a second column, said first column and said second column being parallel and disposed on a semiconductor substrate and wherein a plurality of bistable semiconductor memorycircuits are arranged to form a third column between said first and said second columns, and each of said plurality of bistable semiconductor memory circuits is selectively coupled between said pair of differential bit lines.

10. The MOS static memory as defined in claim 9 wherein said MOS field effect device is an n-channel device.

11. The MOS static memory as defined in claim 10 wherein said controlled current path is closed during said write cycles.

12. A semiconductor memory for storing data, said memory comprising:
 a pair of differential bit lines for receiving signals corresponding to
 a semiconductor memory device for storing said data, said semiconductor memory device being coupled between said pair of differential bit lines to provide said signals corresponding to said data when reading said semiconductor memory device,
 a clock means for providing a clock signal during reading of said semiconductor memory device when valid data appears on said pair of differential bit lines;
 a semiconductor clamping device coupled between said pair of differential bit lines, said semiconductor clamping device having a controlled current path between said pair of differential bit lines, said semiconductor clamping device being coupled to said clock means for selectively providing an open current path between said pair of differential bit lines during a substantial portion of the time of actual reading of said semiconductor memory cell when valid data appears on said differential bit lines whereby the voltage difference maintained between said pair of differential bit lines is reduced by said current path during actual reading of said semiconductor memory device.

* * * * *

UNITED STATES PATENT AND TRADEMARK OFFICE
CERTIFICATE OF CORRECTION

PATENT NO. : 4,785,427

DATED : 11/15/88

INVENTOR(S) : Young

It is certified that error appears in the above-identified patent and that said Letters Patent is hereby corrected as shown below:

| COLUMN | LINE | |
|--------|------|---|
| 03 | 07 | delete "inventiOn" insert --invention-- |
| 06 | 36 | delete "soe" insert --see-- |

Signed and Sealed this

Thirty-first Day of October, 1989

Attest:

DONALD J. QUIGG

Attesting Officer

Commissioner of Patents and Trademarks